US007237171B2

(12) United States Patent
Richardson

(10) Patent No.: US 7,237,171 B2
(45) Date of Patent: *Jun. 26, 2007

(54) METHOD AND APPARATUS FOR PERFORMING LOW-DENSITY PARITY-CHECK (LDPC) CODE OPERATIONS USING A MULTI-LEVEL PERMUTATION

(75) Inventor: Tom Richardson, South Orange, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/174,865

(22) Filed: Jul. 5, 2005

(65) Prior Publication Data

US 2005/0258987 A1    Nov. 24, 2005

Related U.S. Application Data

(63) Continuation of application No. 10/788,115, filed on Feb. 26, 2004, now Pat. No. 6,957,375.

(60) Provisional application No. 60/451,555, filed on Mar. 3, 2003, provisional application No. 60/450,245, filed on Feb. 26, 2003.

(51) Int. Cl.
*H03M 13/13* (2006.01)
(52) U.S. Cl. .................................. 714/752
(58) Field of Classification Search ................ 714/752, 714/780
See application file for complete search history.

(56) References Cited

U.S. PATENT DOCUMENTS

| 3,542,756 | A | 11/1970 | Gallager |
| 3,665,396 | A | 5/1972 | Forney, Jr. |
| 4,295,218 | A | 10/1981 | Tanner |
| 5,157,671 | A | 10/1992 | Karplus |
| 5,271,042 | A | 12/1993 | Borth et al. |
| 5,293,489 | A | 3/1994 | Furui et al. |
| 5,313,609 | A | 5/1994 | Baylor et al. |

(Continued)

OTHER PUBLICATIONS

Boutillon, et al., "Decoder-First Code Design," Proceedings International Symposium on Turbo Codes and Related Topics, Sep. 2001, pp. 459-462.*

(Continued)

*Primary Examiner*—Stephen M. Baker
(74) *Attorney, Agent, or Firm*—Straub and Pokotylo; Michael P. Straub

(57) ABSTRACT

Methods and apparatus of the present invention can be used to implement a communications system wherein different devices using the same LDPC code can be implemented using different levels of parallelism. The use of a novel class of LDPC codes makes such differences in parallelism possible. Use of a factorable permuter in various embodiments of the invention make LDPC devices with different levels of parallelism in the encoder and decoder relatively easy to implement when using the codes in the class of LDPC codes discussed herein. The factorable permuter may be implemented as a controllable multi-stage switching devices which performs none, one, or multiple sequential reordering operations on a Z element vector passed between memory and a Z element vector processor, with the switching one individual vectors being controlled in accordance with the graph structure of the code being implemented.

20 Claims, 8 Drawing Sheets

U.S. PATENT DOCUMENTS

| | | | |
|---|---|---|---|
| 5,396,518 | A | 3/1995 | How |
| 5,457,704 | A | 10/1995 | Hoeher et al. |
| 5,526,501 | A | 6/1996 | Shams |
| 5,615,298 | A | 3/1997 | Chen |
| 5,671,221 | A | 9/1997 | Yang |
| 5,860,085 | A | 1/1999 | Stormon et al. |
| 5,864,703 | A | 1/1999 | van Hook et al. |
| 5,867,538 | A | 2/1999 | Liu |
| 5,892,962 | A | 4/1999 | Cloutier |
| 5,933,650 | A | 8/1999 | van Hook et al. |
| 5,968,198 | A | 10/1999 | Hassan |
| 6,002,881 | A | 12/1999 | York et al. |
| 6,073,250 | A | 6/2000 | Luby et al. |
| 6,195,777 | B1 | 2/2001 | Luby et al. |
| 6,247,158 | B1 | 6/2001 | Smallcomb |
| 6,266,758 | B1 | 7/2001 | van Hook et al. |
| 6,298,438 | B1 | 10/2001 | Thayer et al. |
| 6,339,834 | B1 | 1/2002 | Crozier et al. |
| 6,397,240 | B1 | 5/2002 | Fernando et al. |
| 6,438,180 | B1 | 8/2002 | Kavcic et al. |
| 6,473,010 | B1 | 10/2002 | Vityaev et al. |
| 6,484,284 | B2 | 11/2002 | Smallcomb |
| 6,526,538 | B1 | 2/2003 | Hewitt |
| 6,633,856 | B2 | 10/2003 | Richardson et al. |
| 6,718,504 | B1 | 4/2004 | Coombs et al. |
| 6,731,700 | B1 | 5/2004 | Yakhnich et al. |
| 6,754,804 | B1 | 6/2004 | Hudepohl et al. |
| 6,957,375 | B2 * | 10/2005 | Richardson ................ 714/752 |
| 2004/0034828 | A1 | 2/2004 | Hocevar |

OTHER PUBLICATIONS

Sorokine, et al., "Innovative Coding Scheme for Spread-Spectrum Communications," International Symposium on Personal, Indoor and Mobile Radio Communications, Sep. 1998, pp. 1491-1495.*

Sorokine et al., "Gallagher Codes for CDMA Applications—Part II: Implementations, Complexity, and System Capacity," IEEE Transactions on Communications, vol. 48, No. 11, Nov. 2000, pp. 1818-1828.*

Zhang, et al., "VLSI Implementation-Oriented (3, k)-Regular Low-Density Parity Check Codes," SiPS 2001, Sep. 2001, pp. 25-36.*

Mansour, et al., "On the Architecture-Aware Structure of LDPC Codes from Generalized Ramanujan Graphs and their Decoder Architectures," 2003 Conference on Information Sciences and Systems, Mar. 2002.*

PCT International Search Report, for International Application No. PCT/US04/05783, Feb. 26, 2004.

Richardson et al. "The capacity of low-density parity-check codes under message-passing Decoding", IEEE Transactions on Information Theory; pp. 599-618, Feb. 2001, (same inventor) whole document.

Paranchych et al. "Performance of a digital symbol synchronizer in cochannel interference and noise", IEEE Transactions on Communications, pp. 1945-1954; Nov. 2000, whole document.

Sorokine, V. et al. ".Innovative coding scheme for spread-spectrum communications", The Ninth IEEE International Symposium on Indoor and Mobile Radio Communication, pp. 1491-1495, vol. 3; Sep. 1998, pp. 1491-1495, whole document.

NN77112415. "Digital Encoding of Wide Range Dynamic Analog Signals", IBM Tech. Disclosure Bulletin, Nov. 1, 1997, vol. No. 20; ISSUE No. 6; pp. 2415-2417, whole document.

NN9210335. "Hierarchical Coded Modulation of Data with Fast Decaying Probability Distributions", IBM Tech. Disclosure Bulletin, Oct. 1992, vol. No. 35; ISSUE No. 5; pp. 335-336, whole document.

T. Richardson and R. Urbanke, "An Introduction to the Analysis of Iterative Coding Systems", pp. 1-36.

T. Richardson, A. Shokrollahi, R. Urbanke, "Design of Capacity-Approaching Irregular Low-Density Parity-Check Codes", pp. 1-43 (Mar. 2001).

T. Moors and M. Veeraraghavan, "Preliminary specification and explanation of Zing: An end-to-end protocol for transporting bulk data over optical circuits", pp. 1-55 (May 2001).

Wolfram Research, "Group Ring", downloaded from http://mathworld.wolfram.com/GroupRing.html on Dec. 30, 2004, p. 1 of 1.

Wolfram Research, "Group Algebra", downloaded from http://mathworld.wolfram.com/GroupAlgebra.html on Dec. 30, 2004, p. 1 of 2.

Mohammad M. Mansour, Naresh R. Shanbhag, Session 11: Low-power VLSI decoder architectures for LDPC codes, Proceedings of the 2002 international symposium on Low power electronics and design Aug. 2002, pp. 284-289.

Saied Hemati, Amir H. Banihashemi, VLSI circuits: Iterative decoding in analog CMOS, Proceedings of the 13th ACM Great Lakes Symposium on VLSI Apr. 2003, pp. 15-20.

T. Richardson and R. Urbanke, "The Capacity of Low-Density Parity-Check Codes under Message-Passing Decoding", pp. 1-44 (Mar. 2001).

W. W. Peterson and E.J. Weldon, Jr., "Error-Correcting Codes", Second Edition, The Massachusetts Institute of Technology, pp. 212-213,261-263, 362, (1986).

R. Blahut, "Theory and Practice of Error Control Codes", Library of Congress Cataloging in Publication Data, pp. 47-49, (May 1984).

* cited by examiner $$H = \begin{bmatrix} 0 & 1 & 0 & 0 & 1 & 0 & 0 & 0 & 1 & 0 & 0 & 0 & 0 & 0 & 0 \\ 0 & 0 & 1 & 0 & 0 & 1 & 1 & 0 & 0 & 0 & 0 & 0 & 0 & 0 & 0 \\ 1 & 0 & 0 & 1 & 0 & 0 & 0 & 1 & 0 & 0 & 0 & 0 & 0 & 0 & 0 \\ 0 & 0 & 1 & 0 & 0 & 0 & 0 & 0 & 0 & 1 & 0 & 0 & 1 & 0 & 0 \\ 1 & 0 & 0 & 0 & 0 & 0 & 0 & 0 & 0 & 0 & 1 & 0 & 0 & 1 & 0 \\ 0 & 1 & 0 & 0 & 0 & 0 & 0 & 0 & 0 & 0 & 0 & 1 & 0 & 0 & 1 \\ 1 & 0 & 0 & 0 & 1 & 0 & 0 & 0 & 0 & 0 & 0 & 0 & 0 & 0 & 1 \\ 0 & 1 & 0 & 0 & 0 & 1 & 0 & 0 & 0 & 0 & 0 & 0 & 1 & 0 & 0 \\ 0 & 0 & 1 & 1 & 0 & 0 & 0 & 0 & 0 & 0 & 0 & 0 & 0 & 1 & 0 \\ 0 & 0 & 0 & 1 & 0 & 0 & 0 & 1 & 0 & 0 & 0 & 1 & 0 & 0 & 0 \\ 0 & 0 & 0 & 0 & 1 & 0 & 0 & 0 & 1 & 1 & 0 & 0 & 0 & 0 & 0 \\ 0 & 0 & 0 & 0 & 0 & 1 & 1 & 0 & 0 & 0 & 1 & 0 & 0 & 0 & 0 \end{bmatrix} = \begin{bmatrix} \sigma^1 & \sigma^1 & \sigma^2 & 0 & 0 \\ \sigma^2 & 0 & 0 & \sigma^0 & \sigma^0 \\ \sigma^0 & \sigma^1 & 0 & 0 & \sigma^2 \\ 0 & \sigma^0 & \sigma^1 & \sigma^2 & 0 \end{bmatrix}$$

METHOD AND APPARATUS FOR PERFORMING LOW-DENSITY PARITY-CHECK (LDPC) CODE OPERATIONS USING A MULTI-LEVEL PERMUTATION

RELATED APPLICATIONS

The present application is a continuation of U.S. patent application Ser. No. 10/788,115, filed on Feb. 26, 2004, now U.S. Pat. No. 6,957,375 which claims the benefit of U.S. Provisional Patent Application Ser. No. 60/450,245 filed on Feb. 26, 2003 and U.S. Provisional Patent Application Ser. No. 60/451,555 filed on Mar. 3, 2003 each of which is hereby expressly incorporated by reference.

FIELD OF THE INVENTION

The present invention relates to communications systems and, more particularly, to communications system which use LDPC codes.

BACKGROUND OF THE INVENTION

Nearly all forms of electronic communication and storage systems use error-correcting codes. Error correcting codes compensate for the intrinsic unreliability of information transfer in these systems by introducing redundancy into the data stream. The mathematical foundations of error correcting were established by Shannon. Shannon developed the mathematical concept of the channel in which distortion of signals in communications systems is modeled as a random process. The most fundamental result of Shannon is the Noisy channel theorem, which defines for the channel a capacity, a quantity that specifies the maximum rate at which information can be reliably delivered through the channel. Reliable transmission at rates approaching capacity requires the use of error correcting codes. Thus, error-correcting codes are designed to achieve sufficient reliability while approaching capacity as closely as possible. The complexity of implementing the error correcting code is an additional factor that always comes into play in practical applications of error correcting codes. Recent advances in error correcting coding systems resulting from the invention of turbo codes and the subsequent rediscovery and development of low-density parity-check (LDPC) codes offer coding systems of feasible complexity that can approach Shannon's capacity quite closely.

LDPC codes are well represented by bipartite graphs, often called Tanner graphs, see FIG. 1 diagram 100, in which one set of nodes, the variable nodes 102, corresponds to bits of the codeword and the other set of nodes, the constraint nodes 106, sometimes called check nodes, correspond to the set of parity-check constraints which define the code. Edges 104 in the graph connect variable nodes to constraint nodes. A variable node and a constraint node are said to be neighbors if they are connected by an edge in the graph. One typically assumes that a pair of nodes is connected by at most one edge. LDPC codes can equivalently be represented using the parity check matrix. FIG. 2 presents an example where the indicated vector x 204 is a codeword if and only if Hx=0, where H 202 is a parity check matrix.

To each variable node is associated one bit of the codeword. In some cases some of these bits might be punctured or known. Punctured bits may be desirable in certain code structures and, in liftings (see below), both punctured and known bits can be used to achieve block lengths that are not multiples of the lifting. Punctured bits and known bits are excluded from the transmitted codeword.

A bit sequence associated one-to-one with the variable node sequence is a codeword of the code if and only if, for each constraint node, the bits neighboring the constraint (via their association with variable nodes) sum to zero modulo two, i.e., they comprise an even number of ones.

The decoders and decoding algorithms used to decode LDPC codewords operate by exchanging messages within the graph along the edges and updating these messages by performing computations at the nodes based on the incoming messages. Such algorithms will be generally referred to as message passing algorithms. Each variable node in the graph is initially provided with a soft bit, termed a received value, that indicates an estimate of the associated bit's value as determined by observations from, e.g., the communications channel. Ideally, the estimates for separate bits are statistically independent. This ideal can be, and often is, violated in practice.

The number of edges attached to a node, i.e., a variable node or constraint node, is referred to as the degree of the node. A regular graph or code is one for which all variable nodes have the same degree, j say, and all constraint nodes have the same degree, k say. In this case we say that the code is a (j,k) regular code. These were the codes considered originally by Gallager (1961). In contrast to a "regular" code, an irregular code has constraint nodes and/or variable nodes of differing degrees. For example, some variable nodes may be of degree 4, others of degree 3 and still others of degree 2.

While irregular codes can be more complicated to represent and/or implement, it has been shown that irregular LDPC codes can provide superior error correction/detection performance when compared to regular LDPC codes.

While implementation of LDPC encoders and decoders using multiple parallel processing elements to process sets of data as part of an encoding or decoding operation have proven both useful and reliable, in known implementations the number of parallel processing elements used in a decoder are normally the same as the number of parallel processing elements used in the encoder. Thus, in a system with multiple devices, e.g., a centralized device such as base station and/or satellite, which interacts with multiple mobile devices, the LDPC encoders and decoders in each of the devices in the system would normally have the same level of parallelism.

Given that the centralized device services multiple mobile devices, assuming real time operation and the same level of parallelism within the encoder/decoder, the centralized device will have to operate at a rate many times faster than the individual devices to keep up with the encoding/decoding associated with the various mobile devices being serviced.

From an implementation standpoint, it would be beneficial if the level of parallelism in different LDPC encoder/decoders in a system could be different. Such an approach would allow the level of parallelism in the encoder and/or decoder in a particular device to be matched to the amount of data to be transmitted/received by the device. By minimizing the amount of parallelism in a particular device, implementation costs can be minimized.

Use of large codes, e.g., including many nodes, which correspond to large graph structures offer many advantages over smaller codes, e.g., including only a few nodes, in terms of error resiliency. To implement a large graph structure using a smaller graph, various permutations may be applied to copies of the smaller graph structure and the copies can be linked together to generate a larger graph structure. In encoding/decoding operations, such permutation operations may be implemented by a switching device, referred to herein as a permuter which applies a permutation operation on elements, e.g., bits to be encoded in the case of an encoding operation or messages in the case of a decoding operation, as they are passed between a memory and a vector processing unit which performs LDPC operations in parallel.

Unfortunately, many LDPC codes do not lend themselves to implementations which would allow multiple different levels of parallelism in an encoder and decoder. In addition, while a single simple permutation operation like a cyclic shift is suitable for implementing a permuter suitable for use with many LDPC codes which can be represented using a large graph generated from a smaller graph, such a single permutation operation does not lend itself to implementing LDPC codes which could be implemented using different levels of parallelism.

In view of the above discussion, it should be appreciated that there is a need for codes and methods and apparatus for implementing LDPC encoders/decoders in a manner which allow for different degrees of parallelism in different devices which use the same code, e.g., LDPC graph structure, to perform LDPC encoding and/or LPDC decoding operations. In addition, there is a need for a practical way of implementing such encoders/decoders, e.g., through the use of new and improved permuters which would allow devices to use relatively large codes which can be derived from smaller graphs, but which also allow for different levels of parallelism to be implemented in different devices.

SUMMARY

The method of the present invention can be used to implement a communications system wherein different devices using the same LDPC code can implement different levels of parallelism. In order to obtain a high level of error resiliency, relatively long codewords are often used. For example, a single codeword generated by performing an encoding operation using a LDPC code of the present invention may include a total number of bits T, where T may be several hundred or even thousands of bits. For purposes of explaining the invention it is to be understood that bits to be encoded and/or bits corresponding to a received codeword may be arranged into L Z element vectors, where Z is a positive integer greater than 1. Each Z element vector includes Z elements and may be read from memory. The vector read from memory can then be processed using Z processing units in parallel. In contrast to existing systems, which use the same number of Z processing elements in parallel in an encoder that encodes codewords using a particular LDPC code (graph structure) as are used in the decoder implementing the same LDPC code, the present invention allows for different levels of parallelism in the encoders and decoders using the same code. In some embodiments, the encoder in a device using a particular code is implemented using a different number of parallel processing units than are used in decoder implementing the same code. Encoding is usually less processor intensive than decoding so, in some embodiments, within a single device, different numbers of processing elements are used in parallel in the decoder than in the encoder with the encoder often having fewer processing elements operating in parallel.

Within a system, different devices may have to encode different amounts of data in real time. Consider a base station serving four wireless terminals. Assuming each wireless terminal transmits and receives the same amount of data, the base station will have to encode and decode 4 times as much data as any of the individual wireless terminals. In some embodiments, the base station or satellite which services multiple nodes is implemented using more processing units in parallel than individual wireless terminals serviced by the base station or satellite. In some systems implemented in accordance with the invention, different wireless terminals within the system using the same code are implemented with different number of parallel processing elements to reflect the different amounts of data each device will have to encode and decode. The use of a novel class of LDPC codes which will be discussed below makes such differences in parallelism possible. Use of a factorable permuter in various embodiments of the invention make LDPC devices with different levels of parallelism in the encoder and decoder relatively easy to implement when using the codes in the class of LDPC codes discussed herein.

BRIEF DESCRIPTION OF THE DRAWINGS

FIG. 5 shows an exemplary lifted version of the matrix of FIG. 2, where the Z lifting value=3 and the permutations used are cyclic permutations.

DETAILED DESCRIPTION OF THE INVENTION

Figure 6:
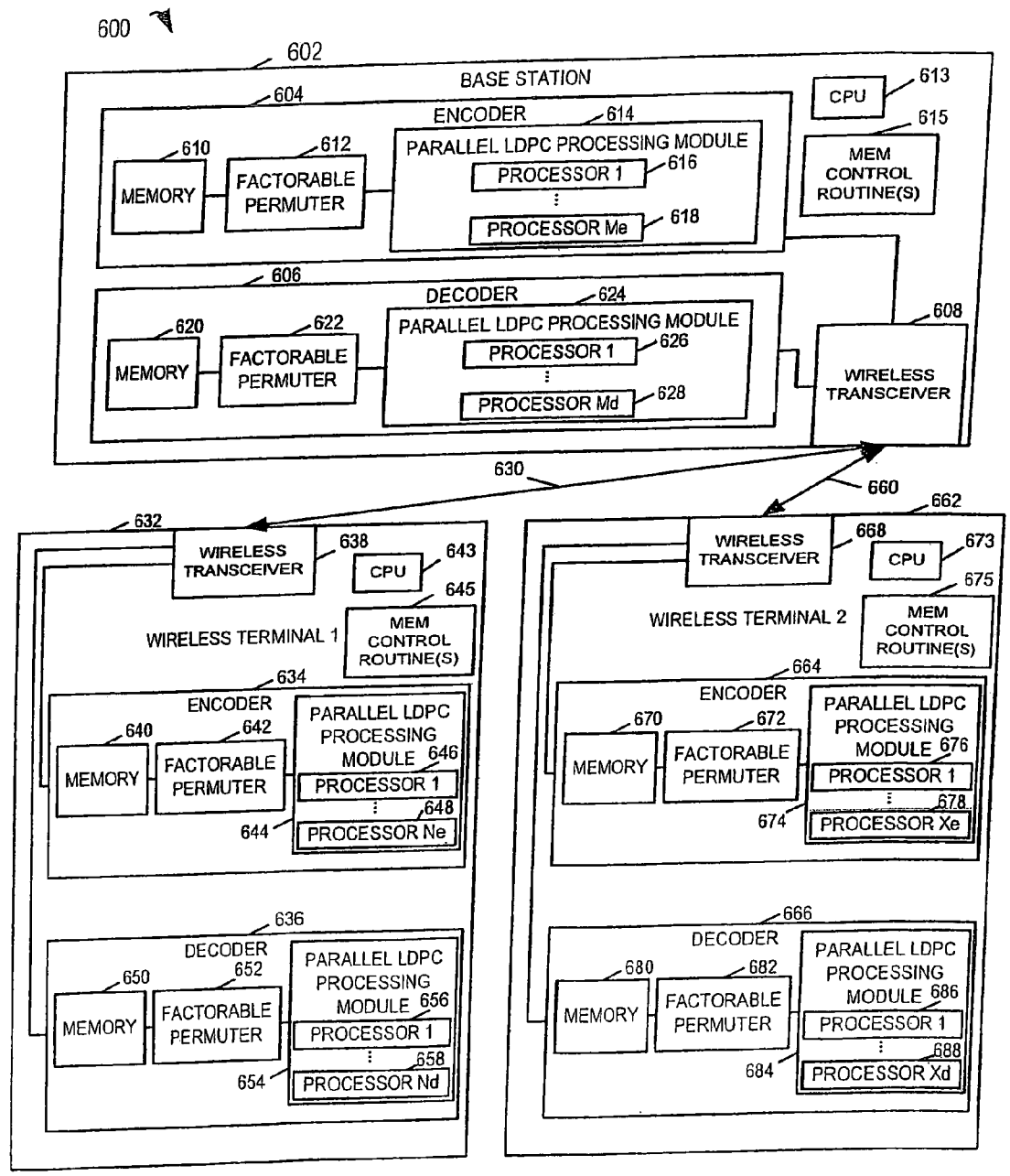
FIG. 6 is an illustration of an exemplary communications system implemented in accordance with the present invention and using methods in accordance with the present invention.

FIG. 6 illustrates an exemplary communications system 600 which includes a base station 602, a first wireless terminal 632 and a second wireless terminal 662. The first and second wireless terminals 632, 662 communication with the base station 602 via wireless links 630, 660. Each of the devices 602, 632, 662 includes an encoder 604, 634, 664 and a decoder 606, 636, 666 implemented in accordance with the present invention. The encoders and decoders of each device are coupled to a wireless transceiver (transmitter/receiver) 608, 638, 668 through which the devices communicate with one another. Each device 602, 632 662 also includes a CPU 613, 643, 673 and a set of control routines which are stored in memory 615, 645, 675. The control routines, when executed by the CPU 613, 643, 673 control the device to perform various communications operations. In some embodiments, routines 615, 645, 675 include an encoder routine and/or a decoder routine which use one or more codes in accordance with the present invention to perform an encoding and/or decoding operation which includes a factorable permutation operation. In the particular example shown in FIG. 6, various encoding and decoding operations are implemented in hardware. In accordance with the novel LPDC encoding and decoding methods of the invention a device having the same general structure can be used for either encoding or decoding operations. In the case of the base station encoder 604 and decoder 606, it can be seen that the basic structure of these devices includes a factorable permuter 612, 622 which is used to couple a memory 610, 620 used to store vectors of elements which are to be processed by a parallel LDPC processing module 614, 624 which includes a number of processing elements (616, 618) (624, 628) which perform parity check operations in parallel. The parallel LDPC processing module 614 includes one processing element for each element of a vector which may be read out of memory 610. Accordingly, when processing Z element vectors (vectors with Z elements) the module 614 will include Z processing elements 616, 618. In the case of the encoder 604 Z=Me.

The number of processing elements Me in the encoder module 614 may be different from the number of processing element Md in the decoder processing module 624. In other words, the encoder and decoder may use vectors with a different number of Z elements, and thus a different level of parallelism, even though they implement the same code. The encoder 604 differs from the decoder 606 in that the vectors read out and processed by the encoder normally include single bit elements, e.g., information values to be encoded. In the case of the decoder elements of vectors which are stored in memory and passed to the processing module 624 normally include elements which each include multiple bits, e.g., are messages, corresponding to portions of a received codeword which are being decoded.

Figure 12:
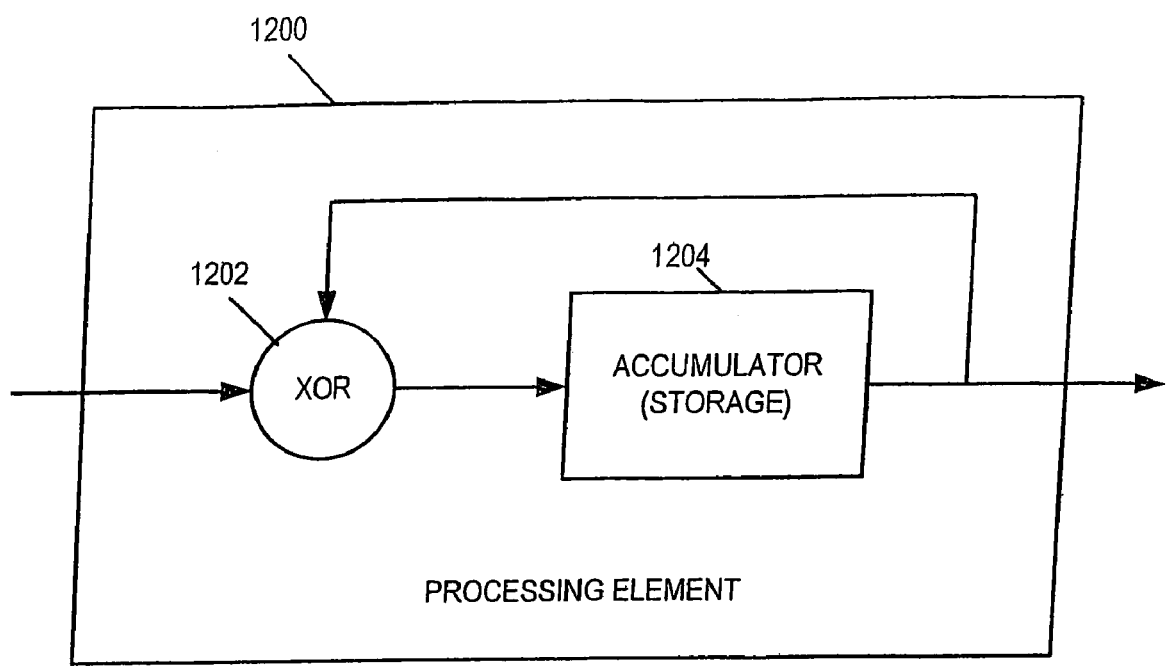
FIG. 12 illustrates an processing element including an XOR circuit and a storage device, e.g., accumulator, which can be used in a parallel LDPC processor module in accordance with the invention.

The encoder 604 and decoder 606 also differ in the processing operation performed by the processing elements (616, 618) and (626, 628). In the case of the encoder 604, each processor normally performs a logical XOR with a stored value and then replaces the stored value with the result of the XOR operation. Thus, processing elements 616, 618 may be implemented using an XOR circuit and a storage element which acts as an accumulator. FIG. 12 illustrates one processing element including an XOR circuit and a storage device, e.g., accumulator, which can be used in a parallel LDPC processor module in accordance with the invention.

At a point in the processing determined by the code (graph structure) being implemented, the result held in the encoder's processors 616, 618 is stored in memory 610. The processing elements 626, 628 perform variable node and/or check node processing operations. While these operations often involve an XOR and accumulate operation, there tend to be additional processing involved with the multi-bit messages being processed by each processing element 626, 628 making decoding operations more complicated than encoding operations.

Several of the patent applications incorporated herein by reference discuss in detail a variety of ways in which the parallel LPDC processing module elements 616, 618, 626, 628 can be implemented.

In accordance with the present invention, factorable permuters 612, 622 perform, on at least some vectors processed by the permuter 612, 622, either a unity permutation operation (no change) or a permutation operation which is the product of two permutation operations. Thus, the factorable permuter may pass a vector without reordering the elements in the vector or, reorder the elements in a vector, e.g., by performing two sequential permutation operations with the output being the vector of reordered elements, said reordering being the result of composing the two permutation operations. Exemplary permutation operations will be discussed in detail in regard to the figures which follow.

In some embodiments factorable permutations are performed as multi-level switching operations. In a first level of switching elements are reordered within the vector being processed, e.g., by shifting n equal sized portions, i.e., subsets of the elements, in the vector using a first cyclic shift. The elements of the processed vector are then further permuted by a second permutation permuting elements within the n equal sized portions but not between portions. The same second permutation is performed on each of the n equal sized portions resulting in the same change in element positions in each of the portions. An equivalent description is as follows. The vector of Z elements are partitioned using a first partition into Z/n equal sized portions and also, using a second partition, into n equal sized portions. This is done in such a way that each of the Z/n equal sized portions in the first partition contain exactly one element in common with each of the n portions in the second partition. Then, the above described first permutation reorders elements within the Z/n portions defined by the first partition, each reordering being identical, but does not alter the first partition. The second permutation reorders elements within the n portions defined by the second partition, each reordering being identical, but does not alter the second partition.

In some embodiments of the present invention, the factorable permuter 612 performs a product of two cyclic permutations also known as cyclic shifts. While a single cyclic shift is not factorable, a product of two cyclic shifts is factorable since it can be factored into the two cyclic shifts which produce the product. To give a concrete example, let us assume Z=4. Under a cyclic shift, a vector $(v_0, v_1, v_2, v_3)$ is reordered as $(v_{0+k}, v_{1+k}, v_{2+k}, v_{3+k})$ where k is an integer on [0,3] an the addition is modulo 4. Under the product of two cyclic shifts of size 2, a vector $(v_0, v_1, v_2, v_3)$ is reordered as $(v_{0+2k+j}, v_{1+2k-j}, v_{2+2k+j}, v_{3+2k-j})$ where k is an integer in [0,1] and j is an integer in [0,1] and all arithmetic is modulo 4. In the case of the product of two cyclic shifts, the first partition is $\{v_0, v_1\}$ $\{v_2, v_3\}$ and the second partition is $\{v_0, v_2\}$ $\{v_1, v_3\}$. The first permutation is decided by choosing j, and the second permutation is decided by choosing k. As will be discussed below, the particular reorderings which are performed are a function of the code being implemented with the reorderings being used to, in effect, connect various nodes in the graph by directing vector elements which are to be processed to the processing element corresponding to a particular node in the graph which defines the code being implemented.

The encoders and decoders of the wireless terminals are similar to those described with regard to the base station encoder 604 and decoder 606, respectively but may implement different levels of parallelism. The encoders 634, 664 and decoder 636, 666 each include a memory 640, 670, 650, 680 which is coupled by a factorable permuter 642, 672, 652, 682 to a parallel LDPC processing module 644, 674, 654, 684 respectively.

The methods and apparatus of the present invention can be better appreciated and understood in the context of various other LDPC coding patents and applications. Various elements, e.g., processing elements which perform LDPC operations, described in the applications included herein, may be used to implement the parallel vector processor described in the exemplary system. Various applications incorporated herein also discuss how memory access and switching operation used to perform permutation operations can be implemented based on stored information providing LDPC code (graph) information. While the codes and permutation operations described are different than those described in the present application, the memory access and switching control operations can be controlled in the same or a similar manner based on stored LPDC code information. Accordingly, such control techniques will be discussed in detail herein. In addition, since such processing elements, e.g., variable node and check node processing elements among others, are described in detail in the incorporated applications, their implementation and function will only be briefly discussed in the present application The following (4) related applications are hereby expressly incorporated by reference and are to be considered part of the present application: U.S. patent application Ser. No. 09/975,331 filed Oct. 10, 2001 entitled "METHODS AND APPARATUS FOR DECODING LDPC CODES" which issued as U.S. Pat. No. 6,633,856 on Oct. 14, 2003, U.S. patent application Ser. No. 10/117,264 filed Apr. 4, 2002 entitled "NODE PROCESSORS FOR USE IN PARITY CHECK DECODERS" which was published on Jan. 30, 2003 as U.S. Published Application number US-2003-0023917-A1, PCT Application S.N. PCT/US02/40573 filed Dec. 18, 2002 entitled "METHODS AND APPARATUS FOR ENCODING LDPC CODES", and U.S. Provisional Application Ser. No. 60/298,480 filed Jun. 15, 2001 entitled "METHODS AND APPARATUS FOR PERFORMING LDPC CODE ENCODING AND DECODING".

Figure 7:
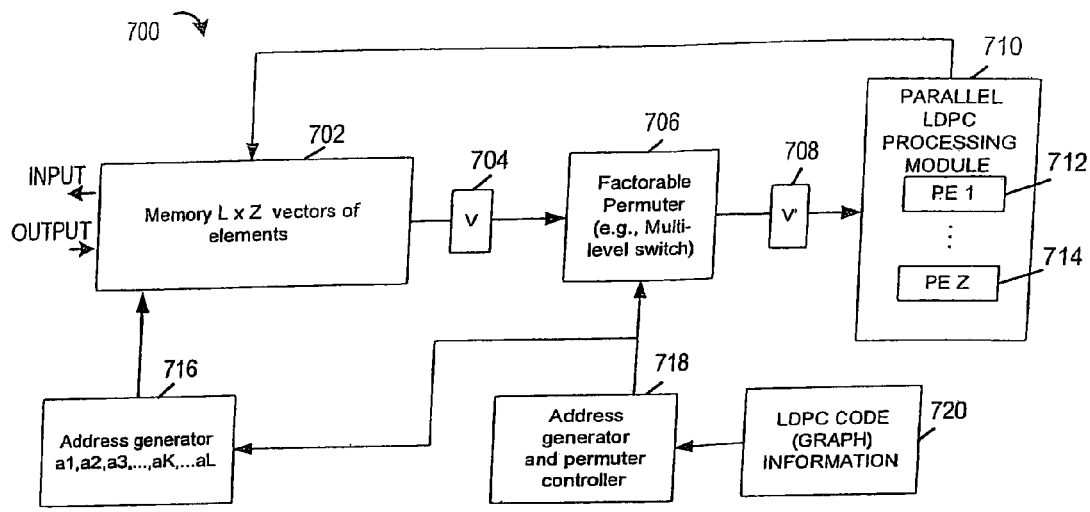
FIG. 7 is an illustration of an exemplary system which can be used to implement LDPC operations in accordance with the present invention.
Figure 8:
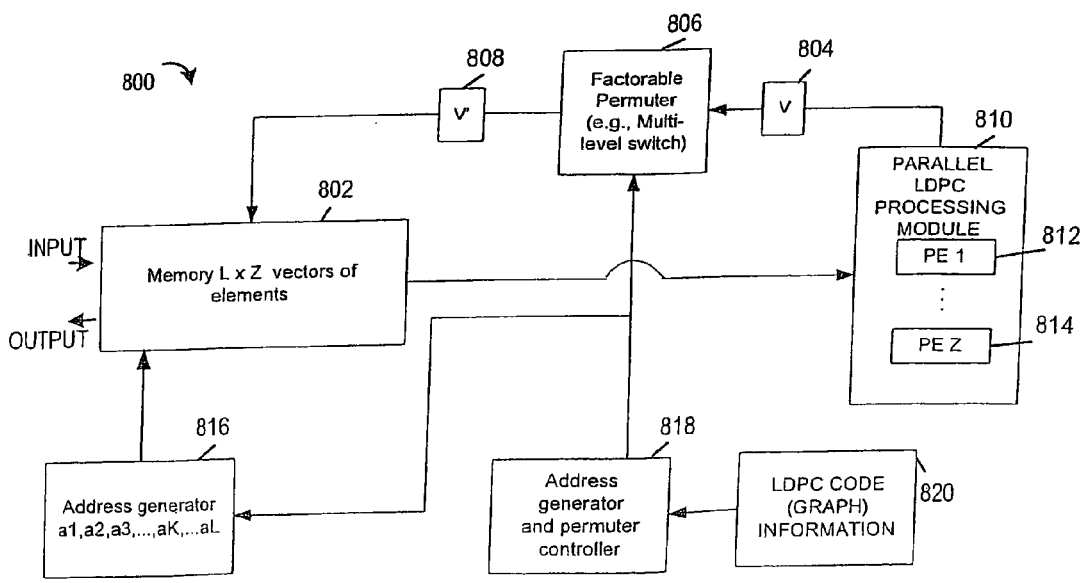
FIG. 8 is an illustration of another exemplary system which can be used to implement LDPC operations in accordance with the present invention.

FIGS. 7 and 8 illustrate exemplary systems 700, 800 which can be used to implement LDPC operations in accordance with the present invention, e.g., either an encoding or a decoding LDPC operation depending on such things as the data to be processed, e.g., a received codeword (implying a decoding operation) or information to be generated into a codeword (implying an encoding operation).

The systems 700, 800 each include a memory 702, 802, an address generator 716, 816, an address generator and permuter controller 718, 818, stored LDPC code (graph) information 720, 820, a Z element parallel LDPC processing module 710, 810 and a factorable permuter 706, 806. Information to be processed is stored in memory 702, 802 via the memory input for processing. In the case of encoding, when processing is complete the result is read out of memory 702, 802. While processing is ongoing, Z element vectors are read from and written to memory under control of the address generator and permuter controller 718, 818. The address generator and permuter controller 718, 818 uses LDPC code (graph) information 720, 820 and information about the level of parallelism which has been implemented, e.g., the number of elements Z to be processed in parallel, to control the address generator 716, 816 to generate addresses used for read and/or write operations while also controlling the factorable permuter 706, 806 to perform the switching operations, vector element reordering, used to achieve the particular implemented graph structure corresponding to the code being implemented. Address generator and permuter controller 718, 818 also generates a control signal which is passed through the address generator 716, 816 to the memory 702, 802 to indicate whether a read or a write is to be performed at any given point in time. Thus, address generator and permuter control 718, 818 controls not only the switching performed by factorable permuter 706, 806 but also when vectors to be processed are read from memory 702, 802 and when processing results generated by modules 710, 810 are written into memory 702, 802.

The main difference between the FIGS. 7 and 8 embodiments is that the factorable permuter 706 in the system 700 performs re-ordering operations on an input vector 704 to generate a reordered vector 708 prior to processing of the vector elements by the processing elements 712, 714 included in the parallel LDPC processing module 710. The results of the processing, e.g, a Z element vector is stored in memory 702. In the case of the FIG. 8 embodiment, the re-ordering by the factorable permuter 806 is performed on the Z element vector 804 generated by the processing elements 812, 814. Whether re-orderings are performed prior to processing by module 710, 810 or subsequent to processing is largely a matter of design choice.

Figures 1, 2:
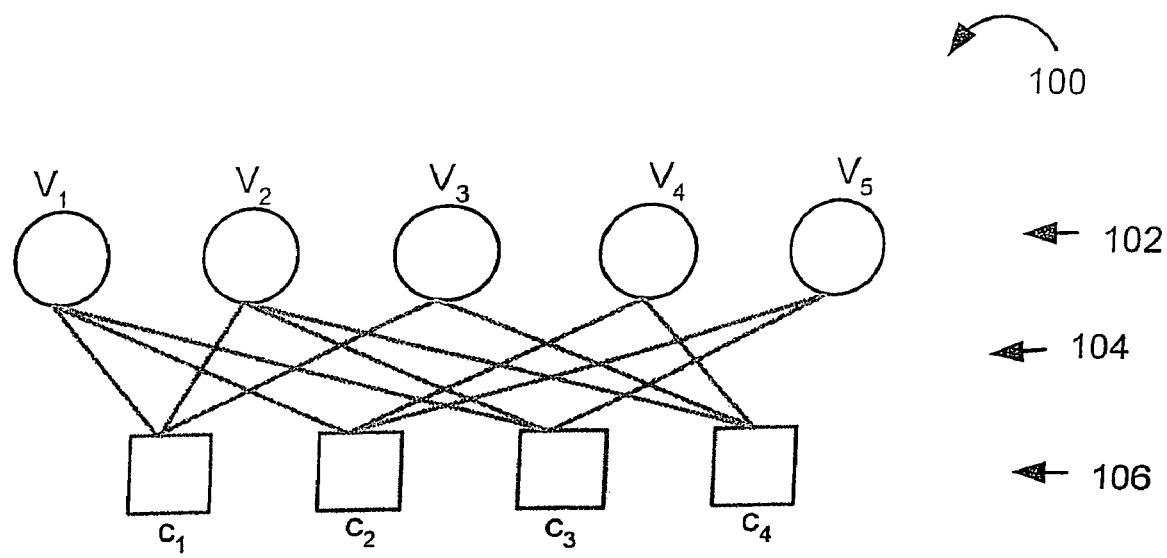
FIG. 1 is a diagram representing an LPDC code as a bipartite (Tanner) graph.
FIG. 2 is a diagram representing an LPDC code using a parity check matrix.
Figures 3, 4:
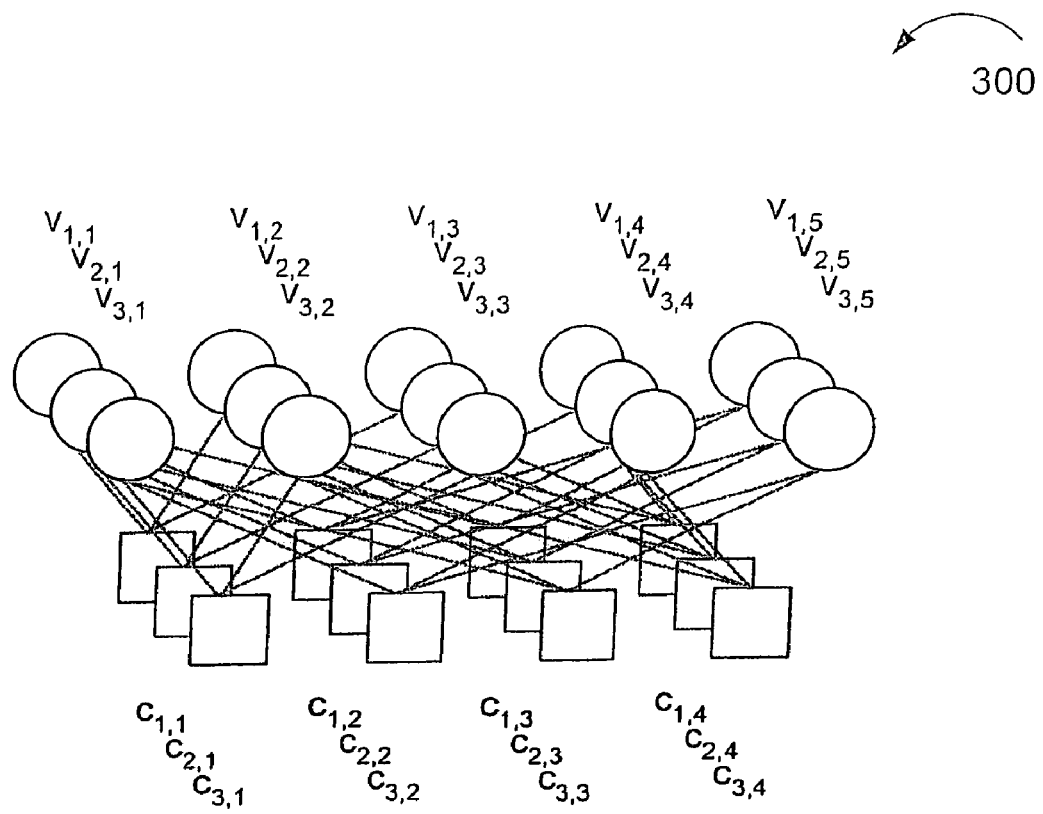
FIG. 3 is a diagram illustrating an exemplary lifting on a Tanner graph.
FIG. 4 is a parity check matrix corresponding to the Tanner graph representation of FIG. 3.

To appreciate the novel codes used in various embodiments of the present invention, and the novel codewords that result from the use of such LDPC codes, "liftings" will now be discussed. In general a "lifting" or vectorization of LDPC codes is described as follows. We start with a Tanner graph or a parity check matrix representation of a small LDPC code, as in FIGS. 1 and 2. We describe the lifting from the parity check matrix perspective first. In a Z-lifting, each entry of the parity check matrix is replaced by a Z×Z matrix. 0 entries in H become 0 Z×Z matrices and 1s in H become permutation matrices, usually belonging to some group. FIG. 5 shows matrix 502, a lifted version of the matrix in FIG. 2 where Z=3 and the permutations used are cyclic permutations. A lifting can be interpreted on the Tanner graph as follows. Each node in the Tanner graph is replaced by Z equivalent nodes, forming a bundle of nodes, and each edge by a bundle of Z edges. Assume that each element of a bundle is given an index in $0, \ldots, Z-1$. A bundle of Z edges connects a bundle of variable nodes to a bundle of constraint nodes. If each connection is made by connecting nodes and edges of like index, then the construction is, in effect Z parallel copies of the original graph. Such a construction is illustrated in FIG. 3 diagram 300 corresponding to the basic example in FIGS. 1 and 2. The parity check matrix corresponding to the graph in FIG. 3 is shown in FIG. 4 drawing 400. If the connections on, e.g., the constraint side are permuted, i.e., the edge with index j is connected to the constraint node with index $\pi(j)$, where $\pi$ denotes a permutation, e.g., a cyclic permutation, on $0, \ldots, Z-1$, then the resulting graph can become fully connected and is viewed as a lifted graph. Note that the projected graph may have multiple edges between a pair of nodes while the lifted graph need not. If, for example, the permutations associated to the edges in a multiple edge are all distinct, then the lifted graph will not have corresponding multiple edges.

An architecture supporting vectorized (or lifted) LDPC codes is described in U.S. patent application Ser. No. 09/975,331 "Methods and apparatus for decoding LDPC codes" which has been incorporated by reference. This architecture supports efficient high speed decoding of a large class of LDPC type codes. The supported codes are lifted or vectorized LDPC codes. In the application Ser. No. 09/975, 331 it was suggested that cyclic permutations were a simple and desirable class of permutations to use. Using these permutations induces a group structure on the code, leading to efficient parallel encoding and decoding where the parallelism is on the scale of the size of the lifting, e.g., of the order of the cyclic structure.

There are situations, it turns out, where it is desirable to have a given code that can be viewed as a lifting not of just one size, but of two or more sizes thereby facilitating the possibility of different levels of parallelism in encoders/decoders using the same code. This realization and the resulting code structures of the present invention allow for efficient encoder and/or decoder implementations which can have different levels of parallelism using the same LDPC codes. Encoders, decoders, codewords and encoded data which use or are produced by the use of the code structures of the present invention are also to be considered features of the invention.

Consider the following example used to explain the invention. We wish to encode in a digital signal processor (DSP), so 16 times parallelism (lifting) is desirable, but we want to make a small decoder, with 4 wide parallelism. The DSP with 16 times parallelism may be used, e.g., in a base station serving 4 mobile devices each of which receives data at roughly ¼ the data rate at which the encoder in the base station operates. Each mobile device in such a system may use the same code as the encoder but be implemented in accordance with the invention with a decoder with 4 wide parallelism reflecting the fact that the mobile device has approximately 4 times as much time to process the same amount of data. Assuming the base station serves three mobiles, e.g. first and second mobiles operating at roughly ¼ the data rate of the encoder and a third mobile at ½ the data rate of the encoder, decoders using 4 times parallelism in the first two mobiles may be used with 8 times parallelism used in the third mobile which supports decoding at ½ the rate of the encoder.

The method of the present invention of supporting different levels of encoder and decoder parallelism are useful in a wide range of other applications as well. Another example is the following. We wish to design a code for a very high-speed application requiring large parallelism. We would like to simulate the code on an FPGA (Floating Point Gate Array) platform before proceeding to an ASIC implementation. The FPGA does not support the parallelism required of the application so we cannot simulate the exact code intended for the final application. In the first case, it would be desirable to have a code that can be viewed both as a 4-lifting and a 16-lifting. In a second case we might want a code that is simultaneously a 64-lifting and a 256-lifting. A third scenario is high speed applications where hardware encoders are required. Since hardware encoders generally run faster than decoders we would like to be able to reduce the parallelism (gate count) in the encoder and run it at slower speeds, more closely matching the decoder speed. A fourth scenario is a standardized code that requires implementation at different throughputs, e.g., at different speeds. A fifth scenario is software implementations: the structure of the code can be matched to the inherent parallelism in typical micro-processors. The current invention makes the above possible while maintaining a level of permutation complexity that is close to that required for cyclic permutations. Moreover, there is a potential savings in complexity with regard to the description of the code: if the code has more parallelism than the implementation (by having another factor in the product) then that additional structure can be used to yield a more compact description of the code. This can allow for simplified message passing control. It is largely in the context of the Vector-LDPC architecture that the benefits of such multi-level or product liftings are realized.

Applicant believes that the LDPC code structures used in various embodiments of the present invention which support different levels of parallelism for a single code have not been suggested in available LDPC literature. It is the inventors realization that the class of LDPC codes used in various embodiments of the present invention, offer implementation benefits especially in the context of the V-LDPC (Vector-LDPC) architecture that forms one of the bases of the invention over other LDPC codes.

Matched Liftings

Before describing product liftings, and to facilitate their description, we first describe a general class of liftings that have additional mathematical structure. We note that liftings by cyclic groups fall in this class.

When the order of (the number of elements in) the group used in the lifting is the same as size Z of the lifting then a mathematical structure arises that can be advantageously exploited. We refer to such a lifting as a matched lifting. In a matched lifting, sums over GF[2] of the Z×Z permutation matrices used in the lifting and binary vectors of length Z can simultaneously be identified with elements of a ring. Elements of the ring can be conveniently represented as binary vectors of length Z where addition is bit-wise modulo 2 addition and multiplication arises from the group structure. As a consequence, replacing each element of the projected parity check matrix with an element of the ring forms a lifted parity check matrix. Replacing each bit with an element of the ring lifts the binary codeword of the projected graph. The overall code is still binary, but it is represented as a Z-times smaller code over the ring. One can show that binary matrix operations on the full lifted parity check matrix can be mimicked as operations over the ring. This simplifies encoder extraction dramatically. Moreover, the mathematical structure guarantees that encoding may be performed in the ring.

We now present the mathematical structure of matched liftings.

Suppose we have a group g of order Z with elements $g_1, \ldots, g_z$, where, by convention, $g_1$ is the identity element. The group can be represented using permutations $p_1, \ldots, p_z$ by setting $\pi_i(k)=j$ if and only if $g_i g_k = g_j$. Correspondingly, we can represent the group using Z×Z permutation matrices $G^1, \ldots, G^z$ where $G^i_{\pi_i(k), k}=1$ for $k=1, \ldots, Z$ and all other entries are 0.

Given such a group we define a ring whose elements are binary vectors of length Z. A binary vector $u=(u_1, \ldots, u_z)$ can be identified with a subset of G, or, equivalently, with a formal sum $$1 \sum_{i=0}^{Z} u_i G^i.$$

Here, $u_i=1$ indicates that $g_i$ is an element of the subset and $u_i=0$ indicates that $g_i$ is not an element of the subset. By the correspondence of $g_i$ with $G^i$ we can interpret the sum as a matrix sum $$M(u) := \sum_{i=1}^{Z} u_i G^i$$

where addition is modulo two, i.e., over GF[2]. Hence, M(u) is a matrix over GF[2]. Note that this sum is invertible, i.e., $$\sum_{i=0}^{Z-1} u_i G^i$$

uniquely determines u.

Given two binary vectors u and v their product w:=uv is given uniquely by M(w)=M(u)M(v). Note, moreover, that if we interpret v is a column vector over GF[2] then w=M(u)v.

Now that we have defined multiplication for binary vectors, we have a defined a ring which we denote by $\mathcal{R}$. Unary elements of $\mathcal{R}$ are those elements whose binary vector representation has exactly one 1 and Z-1 0s.

Consider again the lifting indicated in FIG. 5. Now, the matrix on the right in that figure can be interpreted a matrix of elements in $\mathcal{R}$, where $\mathcal{R}$ is the ring induced by cyclic permutations of size K (=3 in the example). The code is still the set of solutions to the parity check equation Hx=0, but elements of H and elements of x belong to $\mathcal{R}$: The codeword is thus a vector of length K over $\mathcal{R}$. Each element may be interpreted as a binary vector of length Z so the codeword is a binary vector of length ZK. The J×K parity check matrix contains elements of the ring, but it also may be interpreted as a binary matrix of size ZJ×ZK.

Recognizing Codewords of Matched Lifted Codes.

A codeword $x=(x_1, \ldots, x_K)$ is a codeword over $\mathcal{R}$ if and only if each vector x u=$(x_1 u, \ldots, x_K u)$ is a codeword for each element u∈$\mathcal{R}$. This condition characterizes codewords of matched liftings. Thus an LDPC systems based on a product lifting (see below) can be identified by the fact that the code, suitably partitioned, is invariant under element-wise multiplication by elements of a product ring.

Encoding of Matched Liftings.

The matched lifting formalism simplifies our understanding of encoding such LDPC codes and can lead to a simplified encoding process.

To build an encoder for a general LDPC code, the first step is to find a permutation of the rows and columns of H so that, up to reordering, we can write $$H = \begin{bmatrix} T & A & B \\ E & C & D \end{bmatrix}$$

where T is t×t upper triangular, E is g×t, A is t×g, C is g×g, B is t×(n−m), D is g×(n−m) and t+g=m. Moreover the g×g matrix $\phi := ET^{-1}A+C$ is invertible (we assume here that H is full row rank.)

Encoding the proceeds as follows. Given information bits $x^s$ we solve $$[TAB][y0x^s]^T = 0$$

for y using back-substitution. Next we solve $$\phi x^{p2} = [ECD][y0x^s]^T$$

for $x^{p2}$. For this step the matrix $\phi^{-1}$ is pre-computed. Finally, one solves $$[TAB][x^{p1}x^{p2}x^s]^T = 0$$

for $x^{p1}$ using back substitution. The vector $[x^{p1}x^{p2}x^s]^T$ constitutes the codeword.

The idea to encode lifted graphs is to perform the approximate upper triangulation on the projected parity check matrix, but to then perform the encoding by interpreting matrix operations over $\mathcal{R}$. In practical settings, where the size of the lifting is sufficiently large, one can enforce g=1 with no discernible loss in performance. In this case the matrix $ET^{-1}A+C$ and its inverse is an element of $\mathcal{R}$. Invertibility of $ET^{-1}A+C$ needs to be checked in the lifting, i.e., over $\mathcal{R}$. This corresponds with invertibility as a lifted binary matrix, but not necessarily with invertibility of the projected matrix. When forming the diagonal matrix T in the presence of multiple edges, it is preferable that diagonal entries be non-multiple edges, giving rise to unary elements in the lifting.

Multiplication in the ring by a unary element (an element with only one non-zero entry in its vector representation) of the ring can be implemented directly in hardware as a switch. The switch routing mechanisms described in U.S. patent application Ser. No. 09/975,331 and U.S. provisional patent application Ser. No. 60/404,810 are exemplary mechanisms which can be used to implement unary multiplication. Multiplication by non-unary elements is implemented by multiple uses of the switch and adding (over the ring) the results. This corresponds to decomposing multiplication of arbitrary elements of $\mathcal{R}$ into sums of unary multiplications. Such an approach makes the factorable permutation used in various embodiments of the invention possible.

Product Liftings

Product liftings are achieved by choosing a product group for the lifting. A product lifting can equivalently be viewed as a multi-dimensional lifting. Correspondingly, assuming the lifting is matched, the ring $\mathcal{R}$ is a product ring. Consider an example in which a lifting of size 64 is desired. Assume the projected code is of size P, i.e., with P variable nodes. One could choose the cyclic group of size 64 for the lifting. An alternative, in accordance with the invention would be a product of the cyclic group of size 16 and the cyclic group of size 4. This group can be represented as follows. Consider indexing L=0, ... 63 using pairs (a,b), a=0, ..., 15 and b=0, ..., 3 by the invertible map L=4a+b. An element of this product group is a pair (c,d) c=0, ..., 15 and d=0, ..., 3. The action of (c,d) on (a,b) is to permute the pair (a,b) to (a+c mod 16, d+b mod 4). This group also has order 64. The resulting lifted graph, however, can be interpreted as a lifting of a size 4P code by 16 or a size 16P code by 4 or a size P code by 64. Thus, implementations with parallelism 4, 16, or 64 are all simultaneously supported in accordance with the invention. This might be desirable for implementations where high speed decoding with parallelism 64 is needed, but encoding, which is much simpler, is to be performed on a digital signal processor, where the Z=16 representation is much more convenient. The advantages offered by product liftings are realized in the context of the encoder and hardware implementations. The value added by using product liftings is a feature of the invention. Liftings by groups which are not products, e.g., by a cyclic group, allow for liftings of arbitrary size but do not offer the flexibility of product liftings.

The set of codes to which the invention is directed is the case where the lifting group g is a product group, in which case the resulting ring is a product ring. Parallelism in our constructions amounts to parallelising over the ring. When we have a product ring there are subrings so we can also parallelise over those rings, giving us a choice of parallelism for a given code.

Cases that appear in the literature already are when g is a cyclic group or the multiplicative group of a finite field. These cases are not product groups, so our construction has not been anticipated. Furthermore its benefits are apparent only in light of parallel architectures such as the one we have disclosed.

Exemplary Uses

Figure 9:
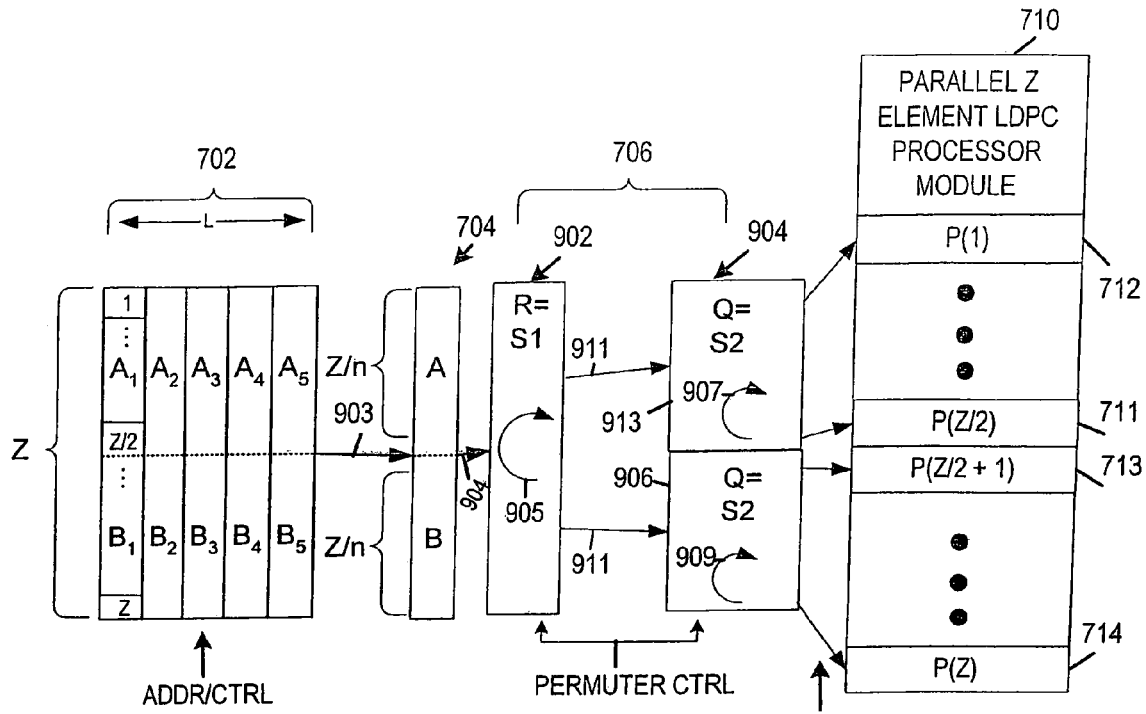
FIGS. 9–11 are examples of using the methods of the present invention in a portion of a system, such as the system shown in FIG. 7, which are used to describe steps of various exemplary methods of the present invention which use a factorable permuter to perform LDPC operations.

Use of factorable permuter 706 which is made possible by the codes of the present invention and the above described product lifting feature will now be described with reference to FIG. 9. FIG. 9 shows a portion of the system 700 including the memory 702, factorable permuter 706 and parallel Z element LDPC processor module 710. The memory 702 includes L Z element vectors. Each Z element vector includes elements 1 through Z. For purposes of explaining the invention the top portion of each Z element vector in memory 702 had been labeled A and the bottom portion B. In the case of encoding operations each element of Z will normally be one bit, e.g., a bit of information to be encoded. The received codeword may include a total of T bits where T/L=Z. The actual number of bits in a codeword can be padded or some bits dropped, e.g., in the case of a punctured code, to make T/L and integer value. In the case of a decoding operation, the elements of each Z element vector will normally be multi-bit messages.

Figure 10:
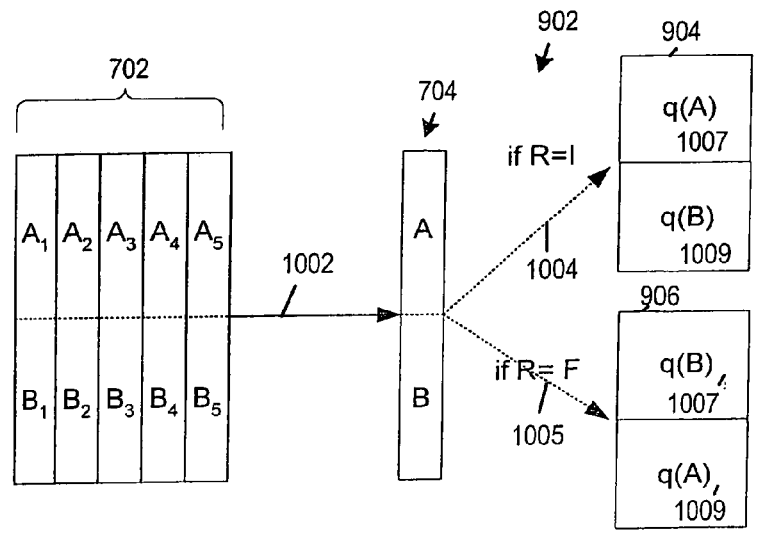
Figure 11:
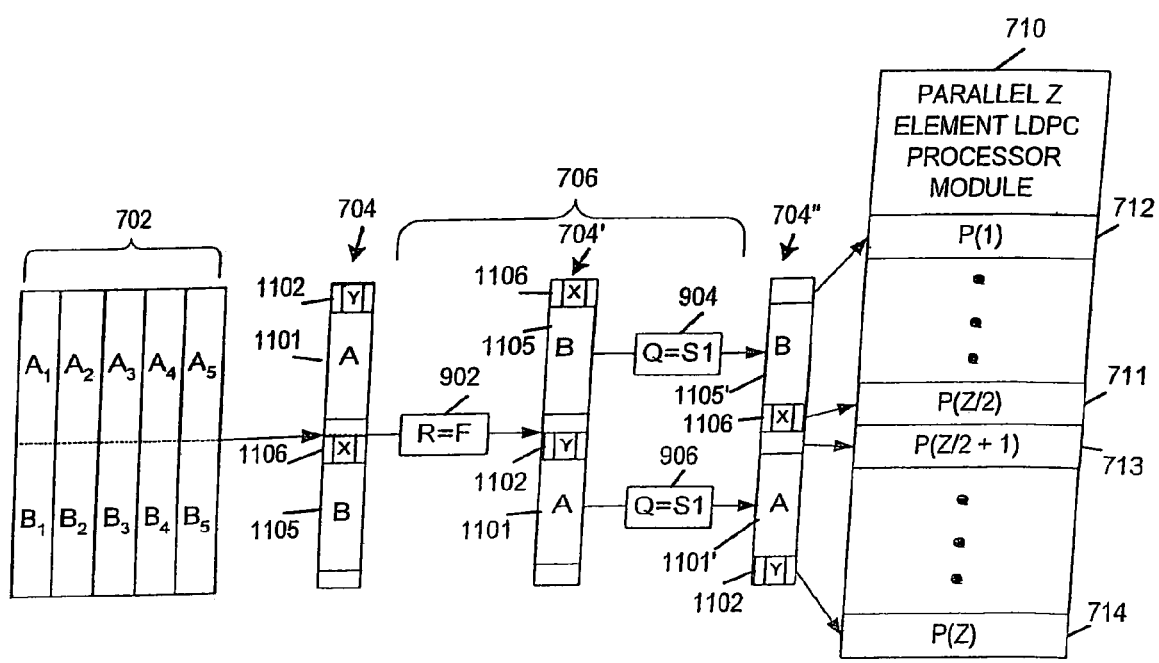

In step 903 a Z element vector is read out of memory 702 in the sequence determined by the address generator which operates under direction of controller 718 to implement the code identified by information 720. Step 904 represents one of the read Z element vectors 704 being supplied to the input of the factorable permuter 706 which performs permutation operations (reorderings of vector elements) under the direction of controller 718. The factorable permuter 706 is implemented as a two stage switching device, a first and second switching device 902, 904 which peform first and second switching steps also referred to herein using refernce numbers 902, 904. The first stage includes first switching circuit 902 which operates on the full vector 704. In this example, switch 902 performs a first cyclic rotation R which causes the elements input vector 704 to shift by S1=Z/n (where n=2 in this example) or S1=0 positions with the vector 704. Thus, portions A and B are swapped, if S1=Z/2, or not, if S1=0. In the examples of FIGS. 9, 10 and 11 n=2. Arrows 911 represent the step of dividing the result of the first permutation (reordering operation) into an integer number n, of equal portions where Z>n>1 which are unchanged by R. The first equal portion 913 and the second equal portion 906 are subjected to the same permutation Q in steps 907 and 909. This second permutation operation causes the elements in each of the equal portions 904, 906 to be reordered within the portion. The reordering R and Q may be an identity reordering (e.g., a shift of 0 or Z) or a shift by some amount which results in an actual change in the order of the elementsThe combination of the first reordering operation with the application of the second reordering Q produces a permutation on the input vector Z which is factorable. The order in which the permutation operation R and permutation operation Q, where Q is applied to n equally sized portions does not matter since the combination of recording operation will produce the same result regardless of the order in which the operations are performed.

Each element of the reordered Z element vector resulting from the application of Q to the each portion 913, 906 is supplied to a different corresponding processing element 712, 711, 713 or 714 of the parallel Z element LDPC processor module 710. As a result of the operation of the factorable permuter 706 in combination with the control of the addressing used to determine the order in which Z element vectors are read out, the code identified by code information 720 can be implemented in a relatively straight forward manner.

By using a factorable permuter 706, code structures which could not be supported using a single simple cyclic shift can be supported. As discussed above, such codes have the advantage of allowing for different levels of decoder and encoder parallelism for the same code.

FIG. 10 illustrates an example where the first permutation operation performed by the permuter 706 can be either an identity (I) permutation or a flip (F) of the upper and lower portions A, B of vector 704. Arrow 1002 represents the step of reading out Z element vector 704 and subjecting it to processing by the permuter 706. In step switching step 902, the first processing path 1004 is followed if the first permutation is an identity permutation. Note that this results in vector 904 being the same as vector 704. Step 1007 represent the application of the permutation Q to the top A portion of vector 904 while step 1009 represents the application of the Q permutation to bottom portion B of vector 904.

If in step 902, R was a flip operation processing would proceed along path 1005 with the resulting Z element vector 906 including B in the top portion and A in the bottom portion. The second permutation Q is then applied to each to these portions in steps 1007' and 1009'

FIG. 11 is another more detailed example how the factorable permuter 706 is used to perform two sequential permutation operations R and Q on a Z element vector 704. In the FIG. 11 example, the Z element vector 704 read out of memory 702 includes a first z/2 portion A 1101 which has element Y 1102 located in position 1. The vector 704 also includes a second portion B 1105 which includes the element X 1106 which is positioned at the start of portion B in vector position Z/2+1. Step 902 represent the application of the first permutation R to the vector 704 to generate the Z element vector 704'. In this example R is a flip, i.e., a first cyclic shift by Z/2 applied to the vector 704. This first cyclic rotation results in the portion B 1105 being shifted to the top portion of the Z element vector 704' and portion A 1101 being shifted to the bottom portion of the Z element vector 704'. This has the result of changing the order of the vector's elements so that element X 1106 is now in the first position and element Y 1102 is in the (Z/2+1) position. The n (where n=2 in this example) even sized portions of intermediate vector 704, portion 1105 and portion 1101 into which the Z element vector 704' is separated for application of the second permutation, are then individually subjected to the second permutation Q in steps 904 and 906. In this example Q is a cyclic shift of one position. This results in the element X 1106 being shifted to the Z/2 position within the first portion 1105' of Z element output vector 704'". It also results in the element Y 1102 being being shifted to the Z position making it the last element in the vector 704" and last element of second portion 1101'. Note that the multi-step reordering process performed by the factorable permuter 706 results in a re-ordering that is not possible using a single cyclic shift on the Z element input vector 704. This novel reordering approach allows codes to be implemented which could not be implemented using a permuter that was capable of only doing single cyclic shift.

Each of the first through Z elements of the permuted vector 704" are supplied to a different one of the first through Z parallel processing elements 712, 711, 713, 714 of module 710. The processing results generated by the parallel processing elements may, and in some embodiments are, written back into memory 702 or, alternatively, can be written into another memory for further processing, e.g., under control of controller 718.

While operation of the 706 has been explained in detail, it is to be understood that the permuter 806 shown in FIG. 8 operates in the same manner except with input vectors being received from the processor parallel LDPC processing instead of memory and the results being written into memory 802.

The FIG. 10 example uses a product lifting with two factor $G=G_2 \times G_{Z/2}$. The group $G_2$ consists of two elements F (flip) and I (identity) defined on $\{0,1\}$ as follows.

$F(0)=1, F(1)=0;$ $I(0)=0, I(1)=1;$

We assume a length L cycle in the process illustrated in FIG. 10.

The present invention is directed to among other things, novel data structures, e.g., codewords, stored on machine readable media such as memory 702 which is used in some embodiments to store one or more codewords generated from input data by an encoder using one of the codes of the present invention and an encoder which implements the encoding methods of the invention.

In particular, some embodiments of the invention are directed to:

A machine readable storage medium in a communications device, comprising:

a data structure in the form of an array y of N×Z bits where N and Z are positive integers, said data structure having been generated by:

operating an encoder circuit to receive an input u which is an array of K×Z bits, where K is a positive integer; and operating said encoder circuit to compute y according to the equation $y=uG$ where y is an array of N×Z bits where N and Z are positive integers,
u is an array of K×Z bits where K is a positive integer,
G is an array of K×N matrix elements where each element of G is a vector of Z bits,
and where y, u and G are generally denoted by:

$y=(y_1, y_2, \ldots, y_N)$ where $y_i$ for i an integer in [1, N] is a Z bit vector, $u=(u_1, u_2, \ldots, u_K)$ where $u_i$ for i an integer in [1, K] is a Z bit vector, $$G = \begin{bmatrix} G_{1,1} & G_{1,2} & \ldots & G_{1,N} \\ G_{2,1} & G_{2,2} & \ldots & G_{2,N} \\ \vdots & \vdots & \vdots & \vdots \\ G_{K-1,1} & G_{K-1,2} & \ldots & G_{K-1,N} \\ G_{K,1} & G_{K,2} & \ldots & G_{K,N} \end{bmatrix},$$

where $G_{i,j}$ for i an integer in [1, K] and j an integer in [1, N] is a Z bit vector, and where $y_i = \sum_{j=1}^{j=K} v_{i,j}$, with $v_{i,j} = u_j G_{i,j}$ being a Z bit vector for each integer i in [1, N] and each integer j in [1, K] and $\Sigma_{j=1}^{j=K} v_{i,j}$ denoting componentwise XOR of the Z bit vectors $v_{i,1}, v_{i,2}, \ldots, v_{i,K}$ to form the Z bit vector $y_i$, where $u_j G_{i,j}$ denotes the PRODUCT of the two Z bit vectors $u_j$ and $G_{i,j}$ where the PRODUCT of two Z bit vectors is defined as follows:

for any Z bit vector $a=(a_1, a_2, \ldots, a_z)$ and any Z bit vector $b=(b_1, b_2, \ldots, b_z)$ their PRODUCT ab is a Z bit vector $d=(d_1, d_2, \ldots, d_z)$ defined by $$d_k = \sum_{\{(i,j): g_i * g_j = g_k\}} a_i b_j$$

where all arithmetic is binary arithmetic meaning $a_i b_j$ is the logical AND of bits $a_i$ and $b_j$ and the summation denotes logical XOR, and where $g=\{g_1, g_2, \ldots, g_z\}_1*$ is a factorable group of order Z where a group g of order Z is a set of Z distinct elements $\{g_1, g_2, \ldots, g_z\}$ together with a group operation * that is mapping of g×g into g given by defining for each pair (i, j) with i and j an integer in [1, Z] a unique integer k in [1, Z] such that $g_i*g_j=g_k$, furthermore, this mapping is associative, meaning $(g_i*g_j)*g_k=g_i*(g_j*g_k)$ for all integers i, j, k in [1, Z], there exists in the group an identity element meaning that for some integer i* in [1, Z] we have $g_{i*}*g_j=g_j*g_{i*}=g_j$ for all j in [1, Z], and each element has an inverse, meaning that for each integer j in [1, Z] there is an integer k in [1, Z] such that $g_j*g_k=g_k*g_j=g_{i*}$, where $g_{i*}$ is the above mentioned identity element and a factorable group of order Z is a group $$g=\{g_1, g_2, \ldots, g_z\}, *$$

of order Z that can be factored into two groups $$A=\{A_1, A_2, \ldots, A_{Z_A}\}, *_A$$

$$B=\{B_1, B_2, \ldots, B_{Z_B}\}, *_B$$

of order $Z_A$ and $Z_B$ respectively satisfying $1<Z_A, Z_B<Z$ and $Z_A Z_B = Z$ and with group operations $*_A$ and $*_B$ respectively, said factoring consisting of identifying each integer i in [1, Z] with a unique ordered pair of integers $(i_A, i_B)$, with $i_A$ an integer in $[1, Z_A]$ and $i_B$ an integer in $[1, Z_A]$, such that $$g_i * g_j = g_k$$

if and only if $$A_{i_A} *_A A_{j_A} = A_{k_A}$$

and $$B_{i_B} *_B B_{j_B} = B_{k_B}$$

where i is identified with the pair $(i_A, i_B)$, j is identified with the pair $(j_A, j_B)$, and k is identified with the pair $(k_A, k_B)$ under the above described identification, where i, j, and k are integers in [1, N] and $(i_A, i_B)$, $(j_A, j_B)$, $(k_A, k_B)$ are each ordered pairs of integers with the first element in $[1, Z_A]$ and the second element in $[1, Z_B]$.

The above described methods may be implemented in a computer system that includes memory, a CPU and one or more input and/or output devices coupled together. The memory includes a routine implemented in accordance with the invention. When executed, the routine causes the CPU to receive, process, and output data in accordance with the present invention.

Alternatively, the steps of the present invention may be implemented using dedicated hardware, e.g., circuits and/or a combination of hardware and software.

What is claimed is:

1. A device for use with a memory for storing a plurality of Z element vectors, each Z element vector including Z elements, each element including at least one bit to be processed, the device being for performing an LDPC processing operation, the device comprising:
    a parallel LDPC processing module including Z processing elements arranged to operate in parallel; and
    controllable factorable permuter means for coupling said memory to said parallel LDPC processing module, said controllable factorable permuter means including switching circuitry, said switching circuitry being responsive to a control signal to perform a factorable permutation operation on a Z element vector being passed through said factorable permuter means, said factorable permutation operation including first and second permutation operations which cause first and second re-orderings of vector elements to occur, said first and second reordering operations being performed on n equally sized vector portions of size Z/n, said first permutation operation causing a change in the order of at least two equally sized vector portions, said second permutation operation being performed on each of the Z/n sized portions to cause a change in the ordering of elements within each of said Z/n sized portions, where n is an integer greater than 1 and less than Z.

2. The device of claim 1, wherein said number n is an integer multiple of 2.

3. The device of claim 1, wherein the first permutation operation is performed after said second permutation operation.

4. The device of claim 1, wherein said first and second reordering operations are cyclic shift operations.

5. The device of claim 1, wherein said factorable permuter means includes a first switching means for performing said first re-ordering and a second switching means for performing said second re-ordering.

6. The device of claim 5, further comprising:
    a set of stored LDPC code information defining at least a portion of an LDPC code which is to be implemented; and
    a permuter controller, the permuter controller being responsive to said stored LDPC code information to control said factorable permuter to implement vector element re-orderings in accordance with at least the portion of the LDPC code which is to be implemented.

7. The device of claim 5,
    further comprising an address generator coupled to said memory; and
    wherein the permuter controller also operates as an address generator controller, said permuter controller controlling the selection of addresses supplied by said address generator at different points in time to coordinate memory access operations with factorable permuter reordering operations.

8. The device of claim 5, wherein each one of the z processing elements in said parallel LDPC processing module includes an XOR circuit and an accumulator.

9. The device of claim 5, wherein each one of the Z processing elements in said parallel LDPC processing module is one of a variable node and a check node processor.

10. A method of implementing an LDPC processing operation, said processing operation being one of an encoding and decoding operation, the method comprising:
    sequentially passing each of a plurality of Z element vectors through a permuter positioned between a memory used to store said plurality of Z element vectors and a Z element vector processor unit including Z processing elements, each Z element vector including Z elements where Z is an integer value greater than 2; and
    controlling said permuter to perform a factorable permutation operation on at least one of the Z element vectors passed between said memory and said vector processing unit to reorder the elements in said at least one Z element vector, said step of performing a factorable permutation operation including:
        performing a first reordering operation on a plurality of first subsets within said at least one Z element vector to change the order of the first subsets of said at least one Z element vector within said Z element vector; and
        performing a second reordering operation on the contents of each of the plurality of first subsets within said at least one Z element vector to change the order of at least some of the elements in each of said plurality of first subsets, the same second reordering operation being performed on each of said first subsets to produce the same change in the order of elements within each of said first subsets.

11. The method of claim 10, wherein said first and second reordering operations are performed sequentially and where said second reordering operation is performed prior to said first reordering operation.

12. The method of claim 10, wherein said first reordering operation is a cyclic shift of subsets within said Z element vector.

13. The method of claim 10, wherein said first reordering operation is a cyclic shift of subsets within said Z element vector.

14. The method of claim 13, wherein each of said plurality of equally sized subsets include n subsets, each of said subsets including Z/n elements, where n is a positive integer, where Z/n is a positive integer, and where $Z > n > 1$.

15. The method of claim 13, wherein said second reordering operation is a cyclic shift of elements within each of said subsets.

16. The method of claim 13, wherein each element of a Z bit vector is a single bit.

17. The method of claim 13, wherein each element of a Z bit vectors is a K bit value, where $K > 1$.

18. The method of claim 13, further comprising:

operating said permuter to pass at least some Z bit vectors without reordering the content of said vectors.

19. The method of claim 18, further comprising:

operating said permuter to perform a first cyclic reordering to rearrange the order of some elements within at least some vectors without performing a second reordering operation on said at least some vectors.

20. The method of claim 19, further comprising:

operating a controller to determine the particular reordering to be applied to a Z vector being passed through said permuter from information defining at least a portion of an LDPC code being used.

* * * * *